United States Patent
Qui et al.

(10) Patent No.: US 12,125,866 B2
(45) Date of Patent: Oct. 22, 2024

(54) METHOD FOR MAKING ISOLATION REGION OF CIS DEVICE

(71) Applicant: HUA HONG SEMICONDUCTOR (WUXI) LIMITED, Wuxi (CN)

(72) Inventors: Yuanyuan Qui, Wuxi (CN); Zhenqiang Guo, Wuxi (CN); Peng Huang, Wuxi (CN); Xiao Fan, Wuxi (CN)

(73) Assignee: HUA HONG SEMICONDUCTOR (WUXI) LIMITED, Wuxi (CN)

( * ) Notice: Subject to any disclaimer, the term of this patent is extended or adjusted under 35 U.S.C. 154(b) by 396 days.

(21) Appl. No.: 17/496,136

(22) Filed: Oct. 7, 2021

(65) Prior Publication Data

US 2022/0199659 A1  Jun. 23, 2022

(30) Foreign Application Priority Data

Dec. 18, 2020  (CN) ......................... 202011513417.X

(51) Int. Cl.
*H01L 31/113*  (2006.01)
*H01L 27/146*  (2006.01)

(52) U.S. Cl.
CPC .... *H01L 27/1463* (2013.01); *H01L 27/14683* (2013.01)

(58) Field of Classification Search
CPC ...................... H01L 27/1463; H01L 27/14683
See application file for complete search history.

(56) References Cited

U.S. PATENT DOCUMENTS

| | | | | |
|---|---|---|---|---|
| 12,028,053 B2 * | 7/2024 | Shank | ................ | H01L 27/1203 |
| 2004/0219724 A1 * | 11/2004 | Park | .................. | H01L 29/1083 257/E21.345 |
| 2008/0124904 A1 * | 5/2008 | Shin | ................ | H01L 21/823807 257/E21.336 |
| 2011/0024764 A1 * | 2/2011 | Kimura | ............. | H01L 29/78675 257/E21.409 |
| 2012/0175691 A1 * | 7/2012 | Wu | ................... | H01L 27/14607 257/292 |
| 2017/0092684 A1 * | 3/2017 | Chang | ................ | H01L 27/1463 |
| 2017/0236854 A1 * | 8/2017 | Lee | ..................... | H01L 27/1464 257/432 |
| 2018/0114806 A1 * | 4/2018 | Kim | .................... | H01L 27/1463 |
| 2021/0143311 A1 * | 5/2021 | Holmes | .................. | H10N 60/01 |

FOREIGN PATENT DOCUMENTS

| CN | 108091662 A | 5/2018 |
|---|---|---|
| CN | 109326518 A | 2/2019 |
| CN | 110854060 A | 2/2020 |

OTHER PUBLICATIONS

Search Report issued in corresponding Chinese Patent Application No. 202011513417X, dated Jun. 28, 2022.

* cited by examiner

*Primary Examiner* — Ali Naraghi
(74) *Attorney, Agent, or Firm* — DILWORTH IP, LLC

(57) ABSTRACT

A method for making an isolation region of a CIS device includes: forming a block layer on a substrate, below the block layer being an oxide layer, below the oxide layer being a silicon nitride layer, and a shallow trench isolation being formed in the substrate; forming a hard mask layer on the surface of the block layer, the material of the hard mask layer is oxide; performing a photolithography process and an etching process to form an isolation region pattern in the hard mask layer; performing an ion implantation process to form an isolation region in the substrate corresponding to the isolation region pattern.

7 Claims, 6 Drawing Sheets

METHOD FOR MAKING ISOLATION REGION OF CIS DEVICE

CROSS-REFERENCES TO RELATED APPLICATIONS

This application claims priority to Chinese patent application No. CN 202011513417.X filed at CNIPA on Dec. 18, 2020, and entitled "METHOD FOR MAKING ISOLATION REGION OF CIS DEVICE, AND SEMICONDUCTOR DEVICE STRUCTURE", the disclosure of which is incorporated herein by reference in entirety.

TECHNICAL FIELD

The present disclosure relates to the field of semiconductor manufacturing, in particular to a method for making an isolation region of a CIS device, and a semiconductor device structure.

BACKGROUND

A CIS (CMOS Image Sensor) is a device used to convert optical signals into electrical signals. The CIS comprises CMOS conversion circuits and pixel cells. Photodiodes are disposed in photosensitive regions of the pixel cells. The larger the area of the photosensitive regions, the more the light collected by the CIS.

As the size of pixel cells in CIS products continuously decreases, the requirement of high aspect ratio high-energy implantation process is becoming higher and higher. As the size of pixel cells decreases, the critical dimension of the isolation region also decreases, but the energy of ion implantation remains unchanged. Therefore, the depth-to-width ratio becomes larger, a higher requirement on the process capability is needed.

In the ion implantation processes, an unopened region needs to be island-shaped, and boron ion high-energy implantation is generally used for ion implantation processes. Due to the small atomic mass and strong penetration of boron ions, the hard mask attaches a high requirement on the depth-to-width ratio in photolithography. If the hard mask does not meet the requirement of the depth-to-width ratio, the isolation of pixel cells will fail.

However, when the critical dimension of the isolation region is small and the photoresist is thick, there will be no process window for the high aspect ratio process due to the limitation of the photolithography process capability and the resolving capability of the machine. Moreover, under the effect of the island-shaped photoresist and the surface tension of the wafer, there will be a phenomenon of photoresist backflow, that is, the photoresist profile is not straight.

BRIEF SUMMARY

According to some embodiments in this application, a method for making an isolation region of a CIS device is disclosed in the following steps: forming a block layer on a substrate, below the block layer being an oxide layer, below the oxide layer being a silicon nitride layer, and a shallow trench isolation being formed in the substrate; forming a hard mask layer on the surface of the block layer, the material of the hard mask layer is oxide; performing a photolithography process and an etching process to form an isolation region pattern in the hard mask layer; performing an ion implantation process to form an isolation region in the substrate corresponding to the isolation region pattern.

In some examples, before forming the block layer on the substrate, the method further comprising: forming a shallow trench in the substrate, a silicon nitride layer being formed on the surface of the substrate; depositing oxides to form the shallow trench isolation in the substrate; performing a CMP process to the substrate, wherein the CMP process ends when the thickness of the oxides on the surface of an active region reaches a predetermined value.

In some examples, before forming the block layer on the substrate, the method further comprising: forming a shallow trench isolation in the substrate, a silicon nitride layer being formed on the surface of the substrate; depositing oxides with a thickness of a predetermined value on the surface of the silicon nitride layer.

In some examples, forming the block layer on the substrate comprising: depositing silicon nitride to form the block layer, wherein the depositing is performed via an LPCVD process.

In some examples, forming the hard mask layer on the surface of the block layer further comprising: performing a CVD process to form the hard mask layer on the surface of the block layer; forming a DARC layer on the hard mask layer.

In some examples, the thickness of the hard mask layer is 300000-400000 angstroms.

In some examples, after performing an ion implantation process to form an isolation region in the substrate corresponding to the isolation region pattern, the method further comprising: performing a wet etching process to remove the hard mask layer; performing a wet etching process to remove the block layer; performing a CMP process to the substrate, wherein the silicon nitride layer on the surface of the substrate is taken as the endpoint in the CMP process.

A semiconductor device structure is manufactured in a process with the CIS devices.

DETAILED DESCRIPTION

Figure 1:
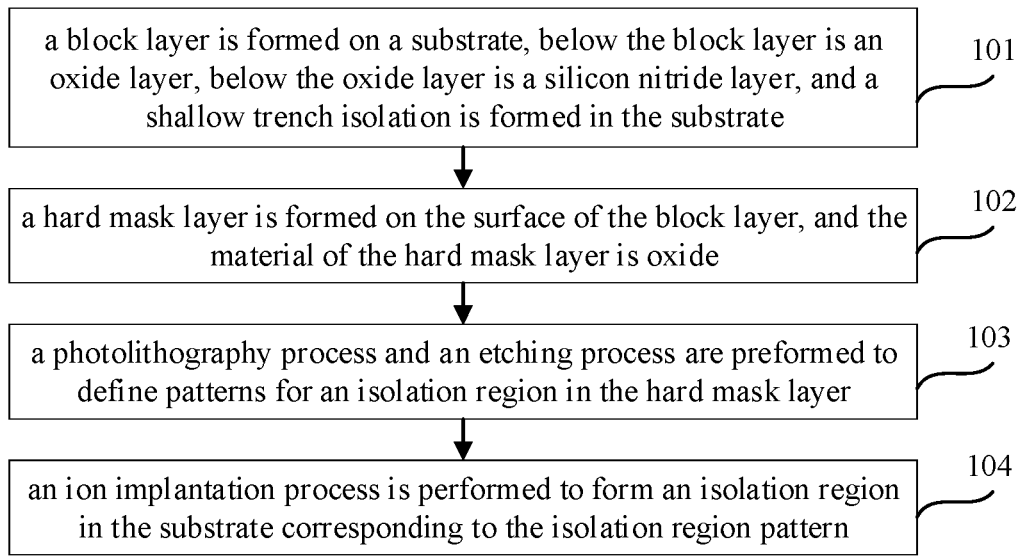
FIG. 1 is a flowchart of the method for making an isolation region of a CIS device according to one embodiment of the present application.

The technical solutions in this application will be clearly and completely described below with reference to the drawings. Obviously, the described embodiments are part of the embodiments of the application, instead of all them. Based on the embodiments in the present application, all other embodiments obtained by one skilled in the art without contributing any inventive labor shall fall into the protection scope of the present application.

In the description of this application, it should be noted that the orientation or positional relationship indicated by the terms "center", "upper", "lower", "left", "right", "vertical", "horizontal", "inside", "outside", or the like is based on the orientation or positional relationship shown in the drawings, is only for the convenience of describing this application and simplified description, and does not indicate or imply that the indicated device or element must have a specific orientation or be configured and operated in a specific orientation. Therefore, the orientation or positional relationship should not to be construed as limitations on the present application. In addition, the terms "first," "second," and "third" are used for descriptive purposes only, and should not be construed to indicate or imply relative importance.

In the description of this application, it should be noted that the terms "installation", "connected", and "connection" should be understood in a broad sense, unless explicitly stated and defined otherwise, for example, they may be fixed connection or removable connection, or integral connection; can be mechanical or electrical connection; can be direct connection, or indirect connection through an intermediate medium, or the internal communication of two elements, and can be wireless or wired connection. For those of ordinary skill in the art, the specific meanings of the above terms in this application can be understood in specific situations.

In addition, the technical features involved in the different implementations of the present application described below can be combined with each other as long as they do not conflict with each other.

One embodiment of the present application provides a method for making an isolation region of a CIS device, including the following steps illustrated in FIG. 1.

In step 101, a block layer is formed on a substrate, below the block layer is an oxide layer, below the oxide layer is a silicon nitride layer, and a shallow trench isolation is formed in the substrate.

Figure 2:
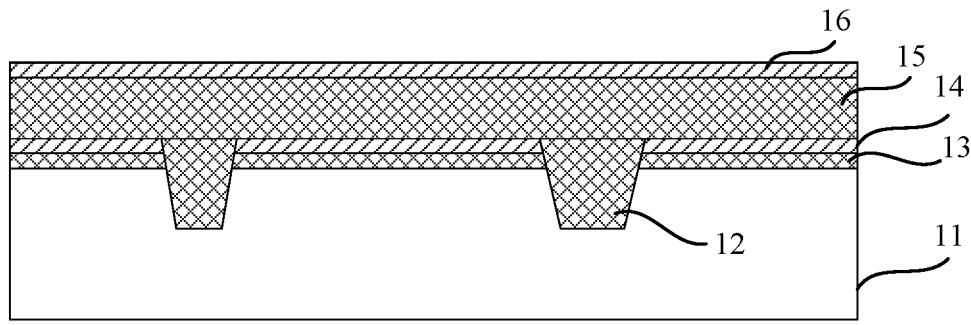
FIG. 2 shows the device cross sectional view after the block layer is formed on the oxide layer, according to one embodiment of the present application.

Referring to FIG. 2, the shallow trench isolation 12 is formed in the substrate 11, a silicon nitride layer 14 is formed on the surface of the substrate 11, and a pad oxide layer 13 is formed between the silicon nitride layer 14 and the substrate 11.

An oxide layer 15 is formed on the silicon nitride layer 14, and a block layer 16 is formed on the surface of the oxide layer 15.

The block layer 16 is used as an etch stop layer and a block layer for the subsequent wet etching processes.

In step 102, a hard mask layer is formed on the surface of the block layer, and the material of the hard mask layer is oxide.

According to the requirement of depth-to-width ratio, a hard mask layer with a thickness of a predetermined value is formed on the surface of the block layer.

Figure 3:
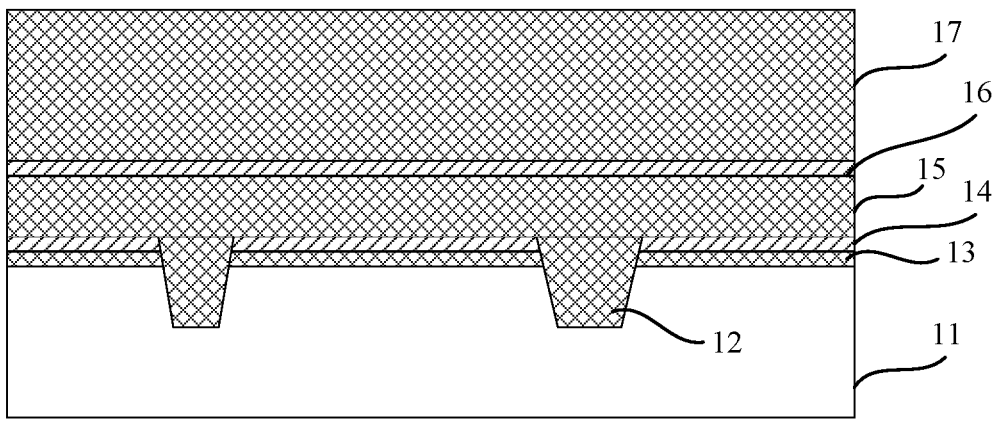
FIG. 3 shows the device cross sectional view after the hard mask layer is formed on the block layer, according to one embodiment of the present application.

Referring to FIG. 3, a hard mask layer 17 is formed on the surface of the block layer 16.

In step 103, a photolithography process and an etching process are preformed to define patterns for an isolation region in the hard mask layer.

Figure 4:
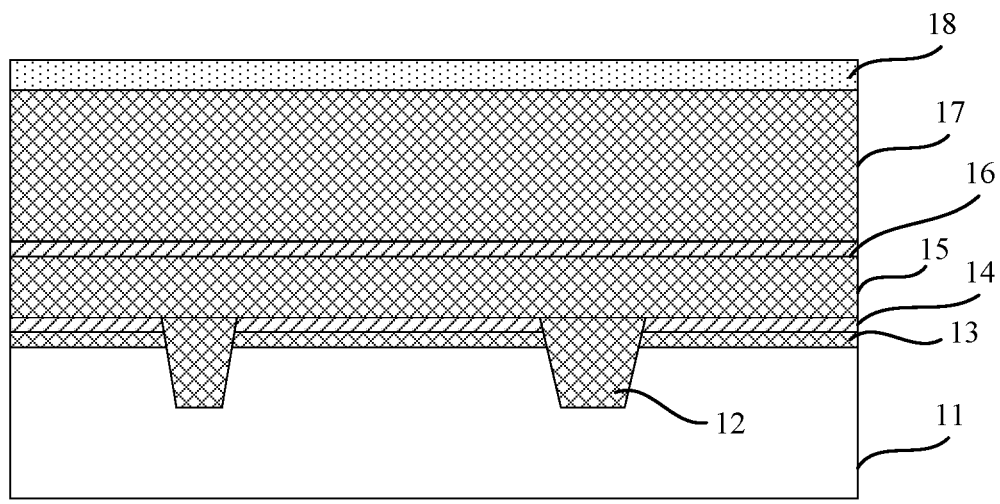
FIG. 4 shows the device cross sectional view after the photoresist is formed on the hard mask layer, according to one embodiment of the present application.
Figure 5:
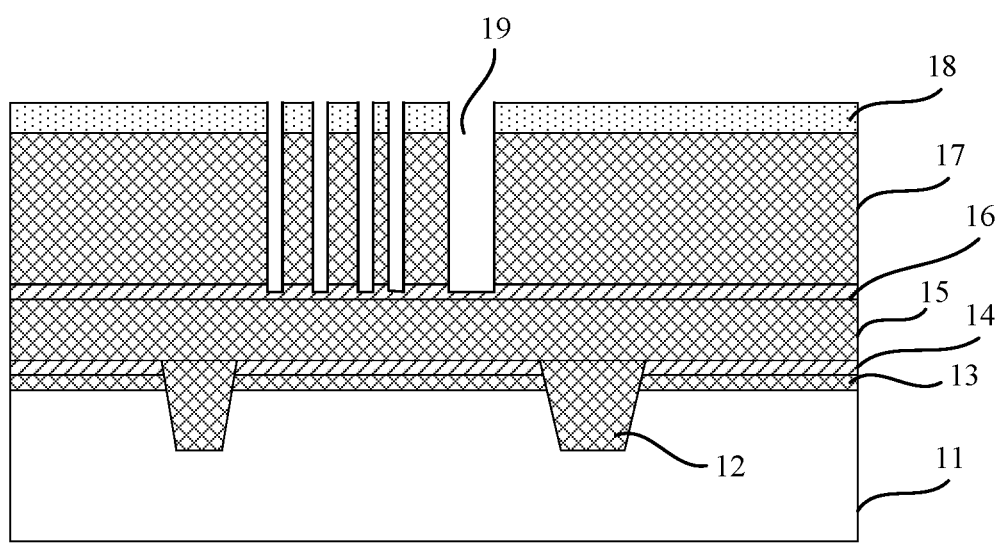
FIG. 5 shows the device cross sectional view after isolation region patterns are defined, according to one embodiment of the present application.
Figure 6:
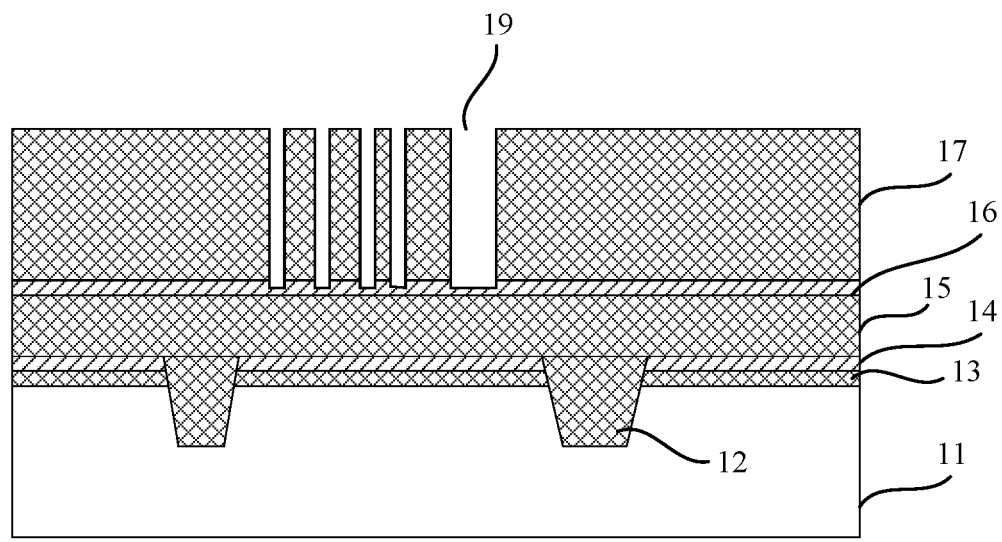
FIG. 6 shows the device cross sectional view after the photoresist is removed, according to one embodiment of the present application.

Referring to FIG. 4, photoresist 18 is coated on the surface of the hard mask layer 17; a mask with isolation region patterns is used for exposure, after development, the isolation region patterns is copied into the photoresist layer 18, then preform an etching process, isolation region patterns 19 are formed in the hard mask layer 17. The device cross sectional view after isolation region patterns is showed in FIG. 5. Then, the processes are preformed to remove the photoresist on the hard mask layer 17. FIG. 6 shows the device cross sectional view after the photoresist is removed.

After the hard mask layer is etched, the profiles of the hard mask on the two sides of the isolation region pattern are straight.

In step 104, an ion implantation process is performed to form an isolation region in the substrate corresponding to the isolation region pattern.

Figure 7:
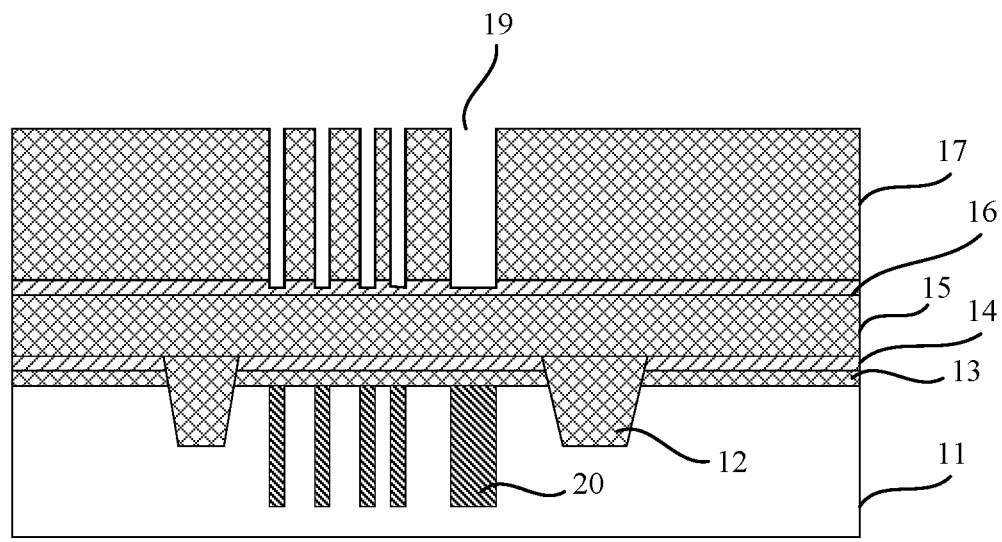
FIG. 7 shows the device cross sectional view after the ion implantation process, according to one embodiment of the present application.

An ion implantation process is performed and an isolation region 20 is formed in a region corresponding to the isolation region pattern 19 in the substrate 11, referring to FIG. 7.

In summary, by forming the block layer and the hard mask layer, and performing the photolithography process and the etching process to form isolation region patterns in the hard mask layer, the requirement of high aspect ratio for small-size devices is met.

Figure 8:
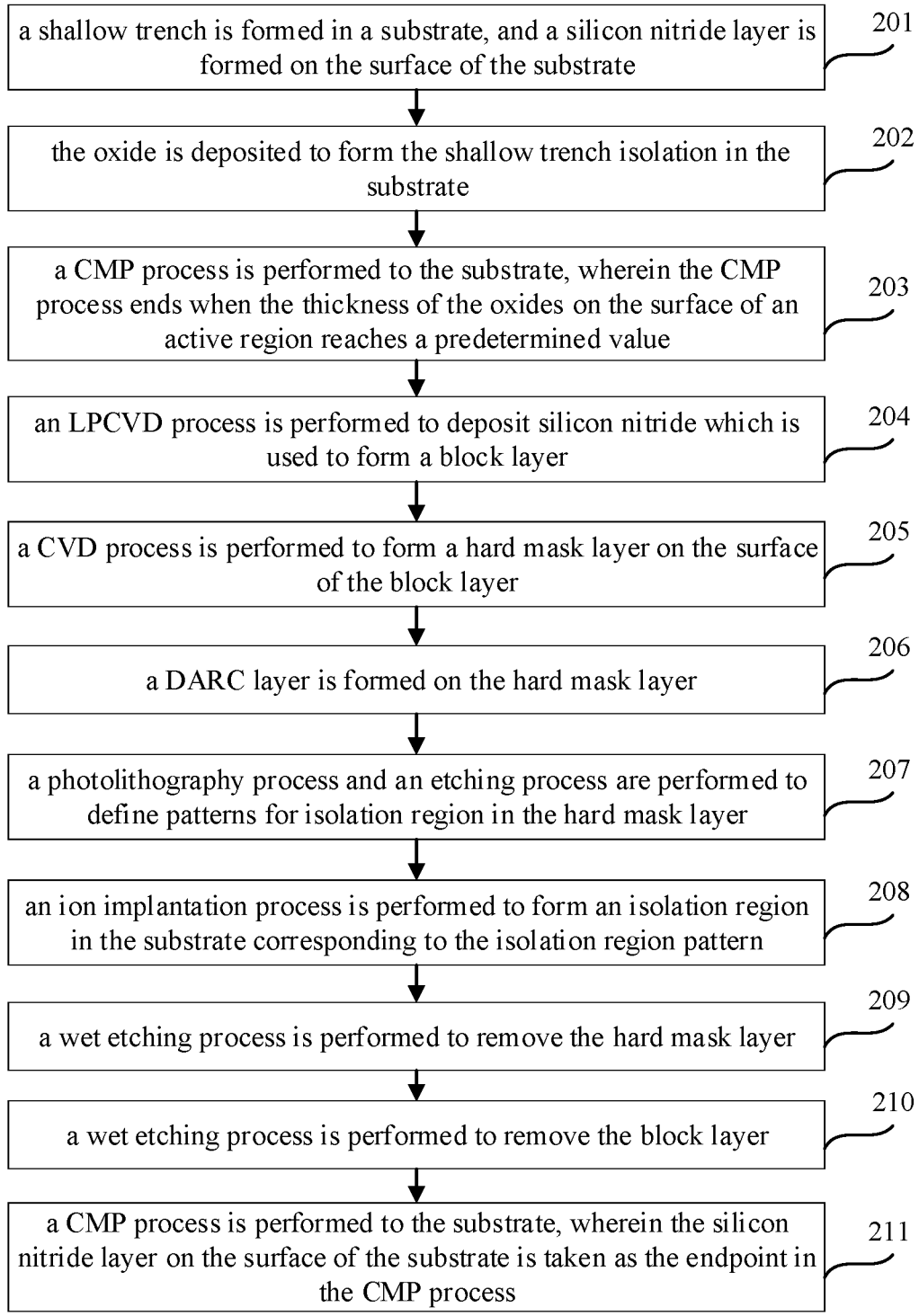
FIG. 8 is a flowchart of the method for making an isolation region of a CIS device according to another embodiment of the present application.

FIG. 8 is a flowchart of the method for making an isolation region of a CIS device according to another embodiment of the present application. The following steps illustrated in FIG. 8 includes:

In step 201, a shallow trench is formed in a substrate, and a silicon nitride layer is formed on the surface of the substrate.

A pad oxide layer is formed on the surface of the substrate, a silicon nitride layer is formed on the surface of the pad oxide layer, and the silicon nitride layer on the surface of the pad oxide layer is used as a hard mask in the formation of a shallow trench isolation; the photolithography and etching processes are performed to form the shallow trench in the substrate.

In step 202, the oxide is deposited to form the shallow trench isolation in the substrate.

The oxide is deposited to fill the shallow trench in the substrate. After the shallow trench in the substrate is completely filled to form the shallow trench isolation, a layer of oxide is formed on the surface of the substrate, which is located above the silicon nitride layer.

In step 203, a CMP process is performed to the substrate, wherein the CMP process ends when the thickness of the oxides on the surface of an active region reaches a predetermined value.

When the CMP process is performed to the substrate, it is necessary to remain the oxide layer with a thickness of a predetermined value above the silicon nitride layer. The oxide layer with the thickness of the predetermined value can protect the underlying device structure when wet etching processes are performed to remove the hard mask layer and the block layer.

In an example, the thickness of a predetermined value is 2000-5000 angstroms.

In step 204, an LPCVD process is performed to deposit silicon nitride which is used to form a block layer.

Referring to FIG. 2, a block layer 16 is formed on the surface of the oxide layer 15.

In step 205, a CVD process is performed to form a hard mask layer on the surface of the block layer.

The material of the hard mask layer is oxide.

In an example, the material of the hard mask layer is silicon dioxide formed by chemical reaction.

In another example, the material of the hard mask layer is silicon dioxide obtained through TEOS decomposition.

The hard mask layer is used as a high-energy ion implantation block layer in the formation of the isolation region.

Referring to FIG. 3, a hard mask layer 17 is formed on the surface of the block layer 16.

The thickness of the hard mask layer is determined according to the requirement of high aspect ratio high-energy ion implantation process. In an example, the thickness of the hard mask layer is 30000-40000 angstroms.

In step 206, a DARC layer is formed on the hard mask layer.

A DARC (Dielectric Anti-Reflective Coating) layer is deposited on the surface of the hard mask layer.

In step 207, a photolithography process and an etching process are performed to define patterns for isolation region in the hard mask layer.

In the photolithography process, the thickness of the photoresist is less than the thickness of the hard mask layer 17.

After the etching process, the profiles of the hard mask sidewalls on the two sides of the isolation region pattern are straight. In an example, the tilt angle of the profile of the hard mask sidewalls is 89°.

In step 208, an ion implantation process is performed to form an isolation region in the substrate corresponding to the isolation region pattern.

In an example, during high-energy ion implantation process, boron ions are implanted into the substrate, the implantation energy is 2500 KeV-3000 KeV, and the implantation dose is 5E13 $cm^{-2}$.

In step 209, a wet etching process is performed to remove the hard mask layer.

In an example, one-sided spraying is performed to the substrate and the wet etching solution is 49% HF.

In step 210, a wet etching process is performed to remove the block layer.

Since the material of the block layer is silicon nitride, in an example, the block layer is removed with hot phosphoric acid.

Figure 9:
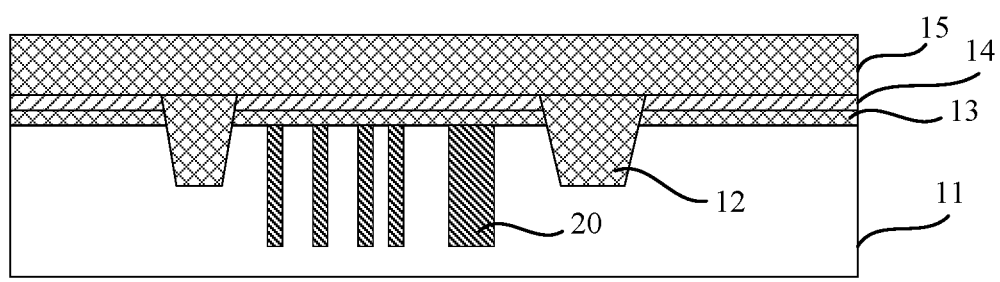
FIG. 9 shows the device cross sectional view after the block layer and the hard mask layer are removed, according to one embodiment of the present application.

FIG. 9 shows the device cross sectional view after the block layer and the hard mask layer are removed, according to one embodiment of the present application.

In step 211, a CMP process is performed to the substrate, wherein the silicon nitride layer on the surface of the substrate is taken as the endpoint in the CMP process.

Figure 10:
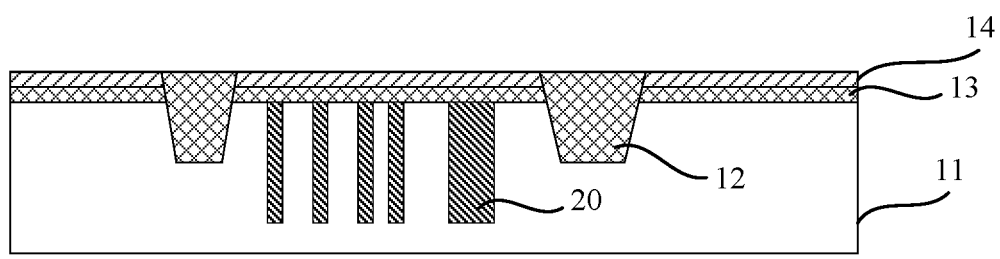
FIG. 10 shows the device cross sectional view after the CMP process, according to one embodiment of the present application.

A CMP process is performed to the substrate, the CMP process is ended when the silicon nitride layer 14 is exposed, FIG. 10 shows the device cross sectional view after the CMP process. During the CMP process, the oxide layer 15 on the surface of the silicon nitride layer 14 is removed.

Figure 11:
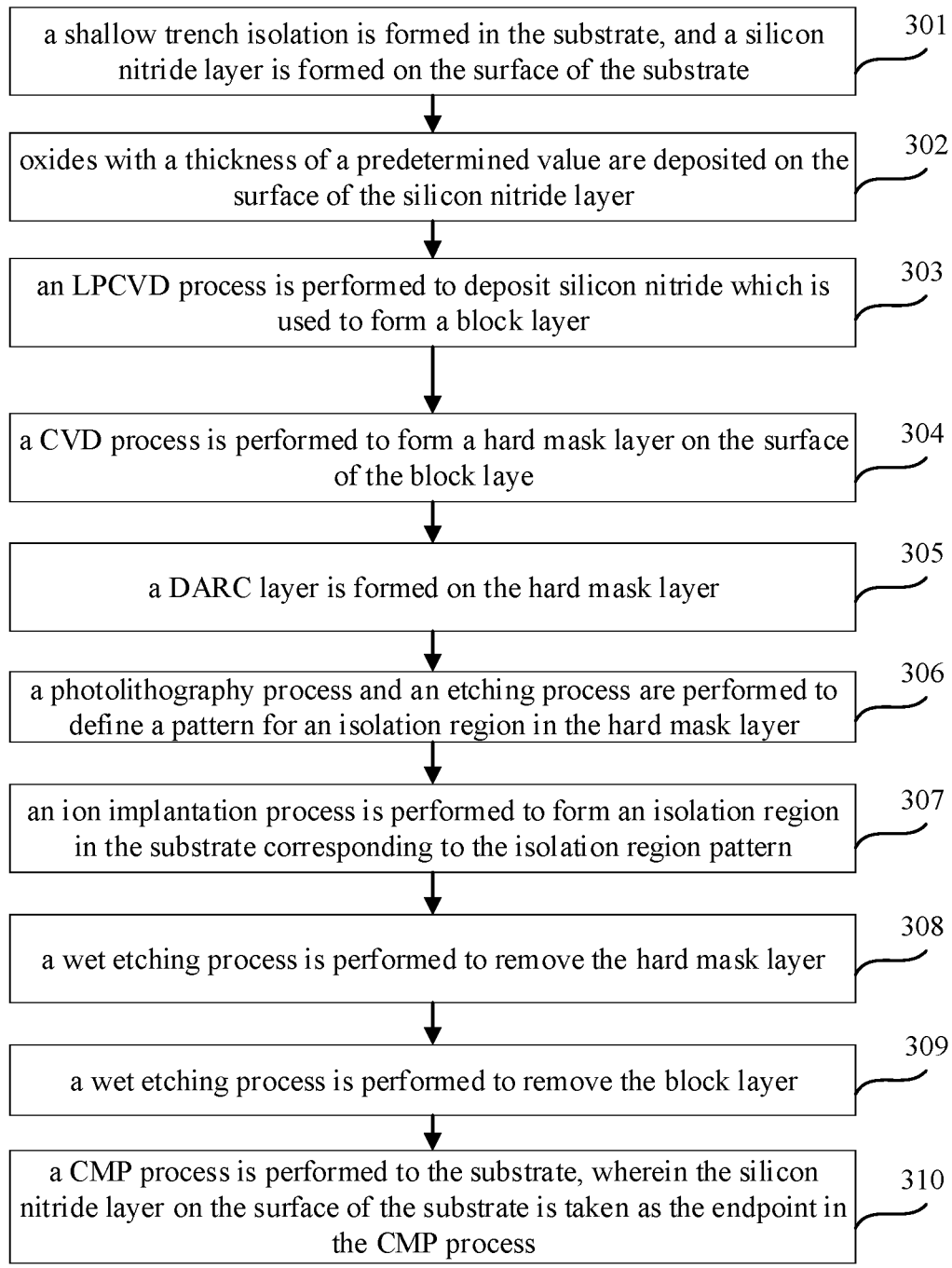
FIG. 11 is a flowchart of the method for making an isolation region of a CIS device according to another embodiment of the present application.

FIG. 11 is a flowchart of the method for making an isolation region of a CIS device according to another embodiment of the present application. The following steps illustrated in FIG. 11 includes:

In step 301, a shallow trench isolation is formed in the substrate, and a silicon nitride layer is formed on the surface of the substrate.

A pad oxide layer is formed on the surface of the substrate, a silicon nitride layer is formed on the surface of the pad oxide layer, a shallow trench is formed in the substrate via photolithography and etching processes, the oxide is deposited to completely fill the shallow trench in the substrate to form a shallow trench isolation, and a CMP process is performed to the surface of the substrate to remove the residual oxide above the silicon nitride layer and expose the silicon nitride layer on the surface of the substrate.

In step 302, oxides with a thickness of a predetermined value are deposited on the surface of the silicon nitride layer.

In an example, the thickness of a predetermined value is 2000-5000 angstroms.

In step 303, an LPCVD process is performed to deposit silicon nitride which is used to form a block layer.

In step 304, a CVD process is performed to form a hard mask layer on the surface of the block layer.

The thickness of the hard mask layer is determined according to the requirement of high aspect ratio high-energy ion implantation process. In an example, the thickness of the hard mask layer is 30000-40000 angstroms.

In an example, the thickness of the hard mask layer is 3000-40000 angstroms.

In an example, the material of the hard mask layer is silicon dioxide formed by chemical reaction.

In another example, the material of the hard mask layer is silicon dioxide obtained through TEOS decomposition.

In step 305, a DARC layer is formed on the hard mask layer.

In step 306, a photolithography process and an etching process are performed to define a pattern for an isolation region in the hard mask layer.

In the photolithography process, the thickness of the photoresist is less than the thickness of the hard mask layer 17.

After the etching process, the profiles of the hard mask sidewalls on the two sides of the isolation region pattern are straight. In an example, the tilt angle of the profile of the hard mask sidewalls is 89°.

In step 307, an ion implantation process is performed to form an isolation region in the substrate corresponding to the isolation region pattern.

In step 308, a wet etching process is performed to remove the hard mask layer.

In an example, one-sided spraying is performed to the substrate to remove the hard mask layer and the wet etching solution is 49% HF.

In step 309, a wet etching process is performed to remove the block layer.

Since the material of the block layer is silicon nitride, in an example, the block layer is removed with hot phosphoric acid.

In step 310, a CMP process is performed to the substrate, wherein the silicon nitride layer on the surface of the substrate is taken as the endpoint in the CMP process.

According to one embodiment of the present application, a semiconductor device structure is shown in FIG. 6, which is manufactured in the manufacturing process of the CIS device. The semiconductor device structure includes a substrate 11.

Referring to FIG. 6, a shallow trench isolation 12 is formed in the substrate 11, a silicon nitride layer 14 is formed on the surface of the substrate 11, an oxide layer 15 is above the silicon nitride layer 14, and a block layer 16 is above the oxide layer 15. Between the silicon nitride layer 14 and the substrate is a pad oxide layer 13.

A hard mask layer 17 is above the block layer 16, and the isolation region pattern 19 is formed in the hard mask layer 17. The material of the hard mask layer 17 is oxide.

That the hard mask layer 17 is used as the block layer during ion implantation overcome the problem that the photoresist does not meet the requirements of high aspect ratio high-energy implantation.

In an example, the material of the block layer is silicon nitride.

The thickness of the hard mask layer is determined according to the requirement of high aspect ratio high-energy ion implantation process. In an example, the thickness of the hard mask layer is 30000-40000 angstroms.

In an example, the thickness of the hard mask layer is 3000-40000 angstroms.

Obviously, the foregoing embodiments are merely for clear description of made examples, and are not limitations on the implementations. For those of ordinary skill in the art, other different forms of changes or modifications can be made on the basis of the above description. There is no need and cannot be exhaustive for all implementations. And, the obvious changes or modifications introduced thereby are still within the protection scope of this application.

REFERENCE SIGNS LIST

Reference numbers in the drawings are listed in the following:
11: substrate;
12: shallow trench isolation;
13: pad oxide layer;
14: silicon nitride layer;
15: oxide layer;
16: block layer;
17: hard mask layer;
18: photoresist;
19: isolation region pattern; and
20: isolation region.

What is claimed is:

1. A method for making an isolation region of a CIS device, comprising:
    forming a block layer on a substrate, below the block layer being an oxide layer, below the oxide layer being a silicon nitride layer, and a shallow trench isolation being formed in the substrate;
    forming a hard mask layer on the surface of the block layer, the material of the hard mask layer is oxide;
    performing a photolithography process and an etching process to form an isolation region pattern in the hard mask layer;
    performing an ion implantation process to form an isolation region in the substrate corresponding to the isolation region pattern.

2. The method for making an isolation region of a CIS device, according to claim 1, wherein before forming the block layer on the substrate, the method further comprising:
    forming a shallow trench in the substrate, a silicon nitride layer being formed on the surface of the substrate;
    depositing oxides to form the shallow trench isolation in the substrate;
    performing a CMP process to the substrate, wherein the CMP process ends when the thickness of the oxides on the surface of an active region reaches a predetermined value.

3. The method for making an isolation region of a CIS device, according to claim 1, wherein before forming the block layer on the substrate, the method further comprising:
    forming a shallow trench isolation in the substrate, a silicon nitride layer being formed on the surface of the substrate;
    depositing oxides with a thickness of a predetermined value on the surface of the silicon nitride layer.

4. The method for making an isolation region of a CIS device, according to claim 1, wherein forming the block layer on the substrate comprising:
    depositing silicon nitride to form the block layer, wherein the depositing is performed via an LPCVD process.

5. The method for making an isolation region of a CIS device, according to claim 1, wherein forming the hard mask layer on the surface of the block layer comprising:
    performing a CVD process to form the hard mask layer on the surface of the block layer;
    forming a DARC layer on the hard mask layer.

6. The method for making an isolation region of a CIS device, according to claim 1, wherein the thickness of the hard mask layer is 300000-400000 angstroms.

7. The method for making an isolation region of a CIS device, according to claim 1 wherein after performing an ion implantation process to form an isolation region in the substrate corresponding to the isolation region pattern, the method further comprising:
    performing a wet etching process to remove the hard mask layer;
    performing a wet etching process to remove the block layer;
    performing a CMP process to the substrate, wherein the silicon nitride layer on the surface of the substrate is taken as the endpoint in the CMP process.

* * * * *

UNITED STATES PATENT AND TRADEMARK OFFICE
CERTIFICATE OF CORRECTION

PATENT NO. : 12,125,866 B2
APPLICATION NO. : 17/496136
DATED : October 22, 2024
INVENTOR(S) : Yuanyuan Qiu et al.

Page 1 of 1

It is certified that error appears in the above-identified patent and that said Letters Patent is hereby corrected as shown below:

On the Title Page

Item (12), should read: Qiu et al.

Item (72), please correct the first named inventor to: Yuanyuan QIU

Signed and Sealed this
Twenty-second Day of April, 2025

Coke Morgan Stewart
*Acting Director of the United States Patent and Trademark Office*